(12) United States Patent
Kim et al.

(10) Patent No.: US 8,735,890 B2
(45) Date of Patent: May 27, 2014

(54) DISPLAY SUBSTRATE AND METHOD OF MANUFACTURING THE DISPLAY SUBSTRATE

(75) Inventors: Ki-Won Kim, Suwon-si (KR); Je-Hun Lee, Seoul (KR); Sung-Haeng Cho, Chengwon-gun (KR); Woo-Geun Lee, Yongin-si (KR); Kap-Soo Yoon, Seoul (KR); Do-Hyun Kim, Seongnam-si (KR); Seung-Ha Choi, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 88 days.

(21) Appl. No.: 13/328,658

(22) Filed: Dec. 16, 2011

(65) Prior Publication Data

US 2012/0211753 A1   Aug. 23, 2012

(30) Foreign Application Priority Data

Feb. 17, 2011   (KR) .......................... 10-2011-0013919

(51) Int. Cl.
  *H01L 29/786*   (2006.01)
(52) U.S. Cl.
  USPC   257/59; 257/57; 257/E29.273; 257/E33.013; 257/E21.09

(58) Field of Classification Search
  USPC ......... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016
  See application file for complete search history.

(56) References Cited

U.S. PATENT DOCUMENTS

2010/0301341 A1\* 12/2010 Huh et al. ........................ 257/59

\* cited by examiner

*Primary Examiner* — Mamadou Diallo
(74) *Attorney, Agent, or Firm* — H.C. Park & Associates, PLC

(57) ABSTRACT

In a display substrate and a method of manufacturing the display substrate, the display substrate includes a data line, a channel pattern, an insulating pattern and a pixel electrode. The data line extends in a direction on a base substrate. The channel pattern is disposed in a separate region between an input electrode connected to the data line and an output electrode spaced apart from the input electrode. The channel pattern makes contact with the input electrode and the output electrode on the input and output electrodes. The insulating pattern is spaced apart from the channel pattern on the base substrate and includes a contact hole exposing the output electrode. The pixel electrode is formed on the insulating pattern to make contact with the output electrode through the contact hole. Thus, a damage of the oxide semiconductor layer may be minimized and a manufacturing process may be simplified.

15 Claims, 10 Drawing Sheets

DISPLAY SUBSTRATE AND METHOD OF MANUFACTURING THE DISPLAY SUBSTRATE

CROSS REFERENCE TO RELATED APPLICATION

This application claims priority from Korean Patent Application No. 2011-0013919, filed on Feb. 17, 2011, which is hereby incorporated by reference for all purposes as if fully set forth herein.

BACKGROUND OF THE INVENTION

1. Field of the Invention

Exemplary embodiments of the present invention relate to a display substrate and a method of manufacturing the display substrate. More particularly, exemplary embodiments of the present invention relate to a display substrate including a thin-film transistor and a method of manufacturing the display substrate.

2. Discussion of the Background

Generally, a thin-film transistor (TFT) includes an active pattern forming a channel between a source electrode and a drain electrode. The active pattern may include amorphous silicon (a-Si), polysilicon (p-Si), oxide semiconductor, etc. An amorphous silicon layer may be easily formed on a large-sized substrate. However, an electron mobility of the amorphous silicon layer is about 0.5 $cm^2/Vs$ so that a driving characteristic of the TFT is not very good. A poly-silicon layer has an electron mobility, which is tens to hundreds of $cm^2/Vs$ greater than the amorphous silicon layer. However, it is difficult to uniformly form the poly-silicon layer on a large-sized substrate, and manufacturing costs for forming the poly-silicon layer are high. The oxide semiconductor has an electron mobility of tens to hundreds of $cm^2/Vs$ and is easily formed on large-sized substrates. In addition, the oxide semiconductor is formed at a low temperature. Thus, the oxide semiconductor has received attention as a semiconductor to replace the amorphous silicon layer or the poly-silicon layer.

Meanwhile, a plurality of patterns of a display substrate are formed using a photolithography process. When the number of masks used for the photolithography process is decreased, the purchase cost of the masks may be decreased. In addition, at least one of an exposure process, a developing process, an etching process and/or a strip process may be omitted to decrease the manufacturing cost and to improve the productivity.

However, when an oxide semiconductor TFT has a structure substantially the same as that of a conventional TFT structure including the a-Si or the p-Si of a bottom gate, the oxide semiconductor layer may be damaged in forming the oxide semiconductor TFT. For example, when the oxide semiconductor layer, and the source and drain electrodes are formed is using a single mask, the oxide semiconductor layer is easily damaged in forming the source and drain electrodes.

In order to solve the above-mentioned problem, a structure including an etch-stopper protecting the oxide semiconductor layer is applied to the oxide semiconductor TFT. However, an additional mask for forming the etch-stopper is needed in forming the oxide semiconductor TFT. Thus, decreasing the number of masks used for forming the oxide semiconductor TFT is limited. In addition, when the oxide semiconductor layer, and the source and drain electrodes are formed using a single mask, forming the source and the drain electrodes is more complicated to prevent damage to the oxide semiconductor layer.

SUMMARY OF THE INVENTION

Exemplary embodiments of the present invention provide a display substrate capable of improving reliability and productivity of a TFT including an oxide semiconductor layer.

Exemplary embodiments of the present invention also provide a method of manufacturing the display substrate capable of simplifying a manufacturing process and minimizing a damage of the oxide semiconductor layer in the manufacturing process.

Additional features of the invention will be set forth in the description which follows, and in part will be apparent from the description, or may be learned by practice of the invention.

An exemplary embodiment of the present invention discloses a display substrate that includes a data line, a channel pattern, an insulating pattern and a pixel electrode. The data line extends in a direction on a base substrate. The channel pattern is disposed in a separate is region between an input electrode connected to the data line and an output electrode spaced apart from the input electrode, and makes contact with the input electrode and the output electrode on the input and output electrodes. The insulating pattern is spaced apart from the channel pattern on the base substrate, and includes a contact hole exposing the output electrode. The pixel electrode is formed on the insulating pattern to make contact with the output electrode through the contact hole.

An exemplary embodiment of the present invention also discloses a method of manufacturing a display substrate. In the method, a source pattern including a data line, an input electrode connected to the data line and an output electrode spaced apart from the input electrode are formed on a base substrate. An oxide semiconductor layer and a first insulating layer formed on the source pattern is patterned to form a channel pattern disposed in a separate region between the input electrode and the output electrode and an insulating pattern, and two opposite end portions of the channel pattern respectively overlap with the input and output electrodes, and an insulating pattern including a contact hole exposing the output electrode. The pixel electrode is formed on the insulating pattern and makes contact with the output electrode through the contact hole.

According to the present invention, the display substrate may include a TFT having minimal damage of the oxide semiconductor layer. Thus, reliability of the display substrate including the TFT may be improved.

In addition, the oxide semiconductor layer is patterned with the first insulating layer using a single mask to decrease the number of masks used for manufacturing the display substrate. Furthermore, the damage of the oxide semiconductor layer may be minimized in pattering the oxide semiconductor layer and the first insulating layer. Therefore, productivity of is the display substrate and reliability in manufacturing the display substrate may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
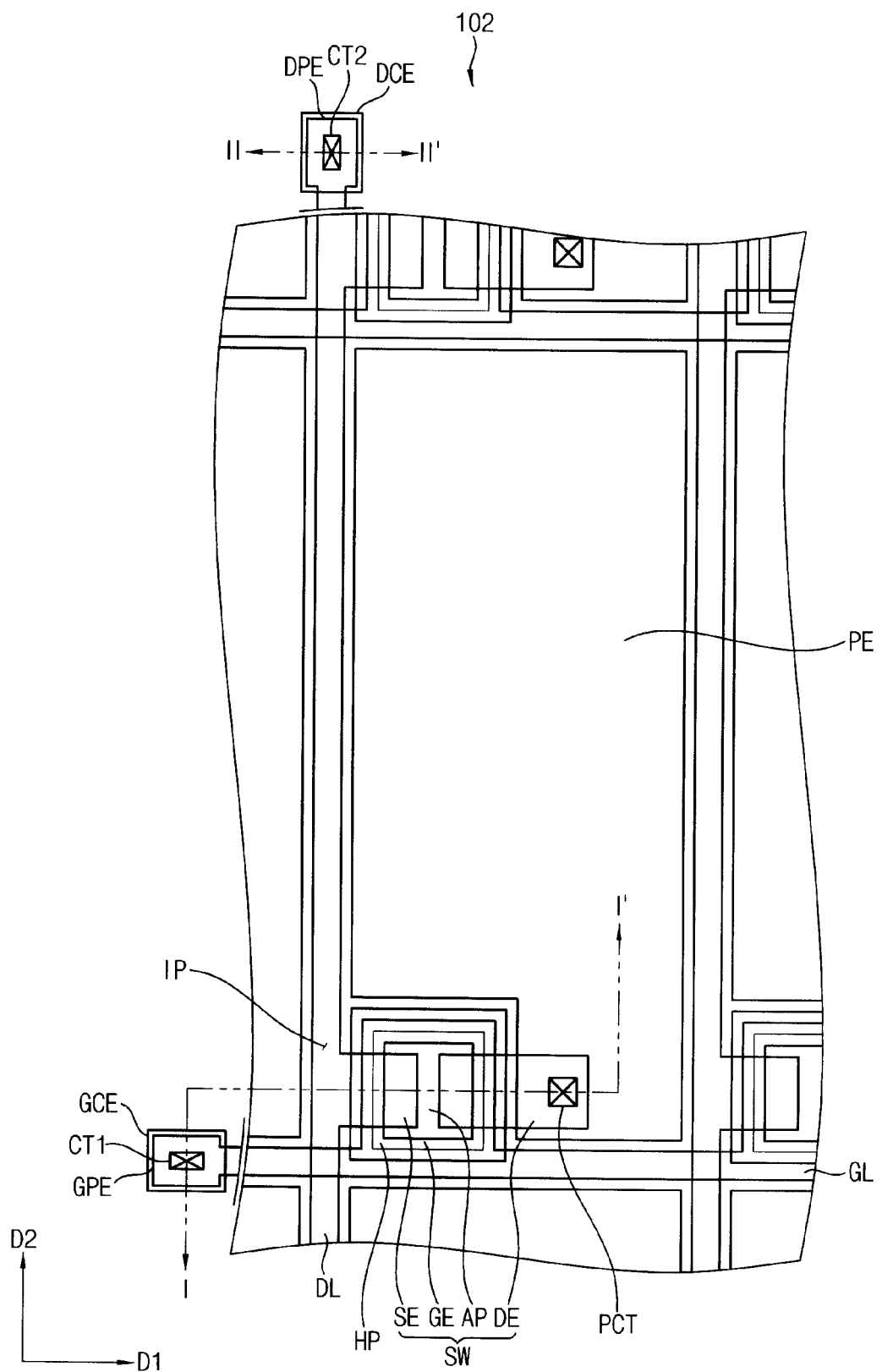
FIG. 1 is a plan view illustrating a display substrate according to an exemplary embodiment of the present invention.

Hereinafter, the present invention will be described more fully with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

FIG. 1 is a plan view illustrating a display substrate according to an exemplary embodiment of the present invention.

Referring to FIG. 1, a display substrate 102 includes a gate line GL, a data line DL, a switching element SW including a channel pattern AP, an insulating pattern IP and a pixel electrode PE. The display substrate 102 further includes a gate pad electrode GPE, a gate contact electrode GCE, a data pad electrode DPE and a data contact electrode DCE.

The gate line GL, the data line DL, the switching element SW and the pixel electrode PE are formed in a display region of the display substrate 102. The gate pad electrode GPE and the data pad electrode DPE are formed in a peripheral region of the display substrate 102 surrounding the display region. A control signal and/or a driving signal may be applied to each of the gate line GL and the data line DL through the gate pad electrode GPE and the data pad electrode DPE.

The gate line GL extends in a first direction D1 of the display substrate 102. The data line DL extends in a second direction D2 different from the first direction D1 to cross the gate line GL. The gate line GL and the data line DL are electrically connected to the switching element SW.

The switching element SW includes a control electrode GE, an input electrode SE and an output electrode DE with the channel pattern AP. The control electrode GE is connected to the gate line GL. The input electrode SE is connected to the data line DL and the output electrode DE is spaced apart from the input electrode SE. The channel pattern AP is formed in a separate region between the input electrode SE and the output electrode DE. The output electrode DE makes contact with the pixel electrode PE through a contact hole PCT so that the switching element SW is electrically connected to the pixel electrode PE.

The gate pad electrode GPE is connected to an end portion of the gate line GL. The gate contact electrode GCE is formed on the gate pad electrode GPE and makes contact with the gate pad electrode GPE through a gate hole CT1. The data pad electrode DPE is connected is to an end portion of the data line DL. The data contact electrode DCE is formed on the data pad electrode DPE and makes contact with the data pad electrode DPE through a data hole CT2.

The contact hole PCT, the gate hole CT1 and the data hole CT2 are formed through the insulating pattern IP surrounding the channel pattern AP. The insulating pattern IP is spaced apart from the channel pattern AP. The channel pattern AP and the insulating pattern IP will be explained later referring to FIG. 2. Hereinafter, a cross-sectional structure of the gate line GL is substantially the same as a layered structure of the control electrode GE in a cross-sectional view, and a cross-sectional structure of the data line DL is substantially the same as a layered structure of each of the input and output electrodes SE and DE. Thus, the description of the layered structures of the control electrode GE and the input electrode SE may suffice for further description of each of the cross-sectional structures of the gate line GL and the data line DL, respectively.

Figure 2:
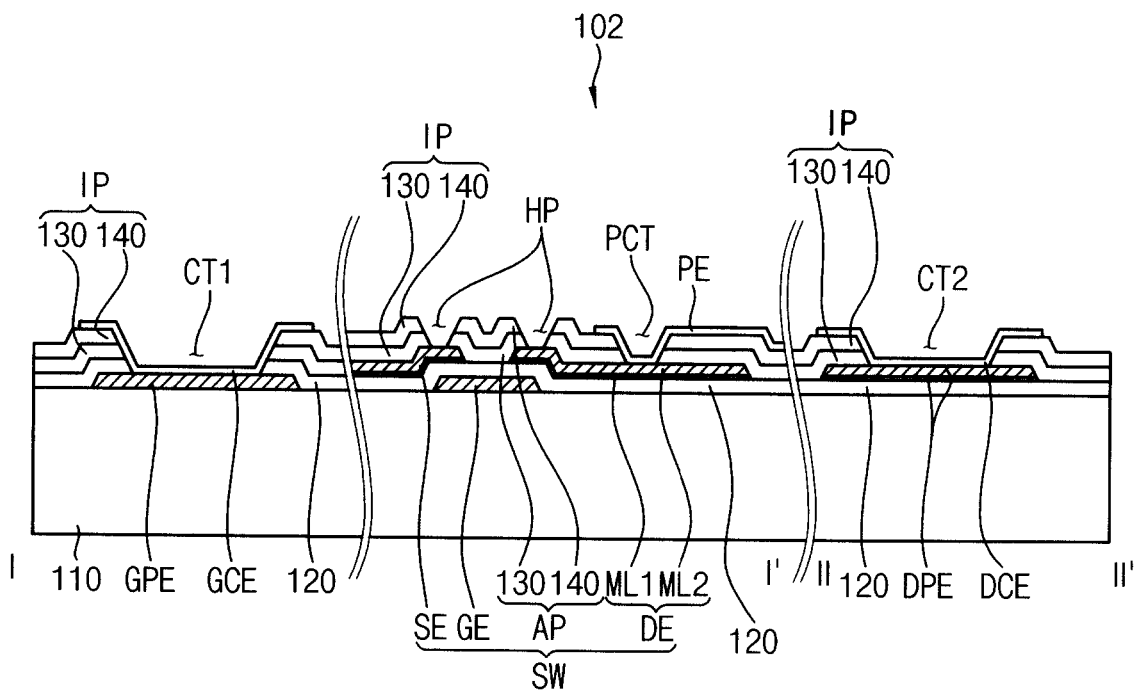
FIG. 2 is a cross-sectional view taken along line I-I' and line II-II' in FIG. 1.

FIG. 2 is a cross-sectional view taken along line I-I' and line II-II' in FIG. 1.

Referring to FIG. 2 and FIG. 1, a gate pattern of the display substrate 102 includes the gate line GL and the control electrode GE, and the gate pattern is formed on a base substrate 110 as a base of the display substrate 102. The gate pattern further includes the gate pad electrode GPE. The gate line GL, the control electrode GE and the gate pad electrode GPE of the gate pattern may include a metal layer of substantially the same metal as each other.

The display substrate 102 further includes a gate insulating layer 120. The gate insulating layer 120 covers the gate line GL and the control electrode GE. A hole is formed through the gate insulating layer 120 which is disposed on the gate pad electrode GPE corresponding to the gate hole CT1. The gate pad electrode GPE is partially exposed through the gate hole CT1 and the hole of the gate insulating layer 120.

A source pattern of the display substrate 102 includes the data line DL, the input electrode SE and the output electrode DE, and the source pattern is formed on the gate insulating layer 120. The source pattern further includes the data pad electrode DPE. The data line DL, the input electrode SE, the output electrode DE and the data pad electrode DPE of the source pattern may include a metal layer of substantially the same metal as each other. The metal layer of the source pattern includes a first source metal layer ML1 and a second source metal layer ML2 formed on the first source metal layer ML1. For example, the first source metal layer may include titanium (Ti) and the second source metal layer may include copper (Cu). Alternatively, each of the first source metal layer ML1 and the second source metal layer ML2 may include aluminum (Al) and molybdenum (Mo).

Alternatively, the metal layer of the source pattern may further include a third source metal layer (not shown) formed on the second source metal layer ML2. Then, the third source metal layer may include titanium (Ti).

The first source metal layer ML1 may prevent the second source metal layer ML2 from being spoiled by a chemical reaction between the gate insulating layer 120 and the second source metal layer ML2. The third source metal layer may minimize a damage of the second source metal layer ML2 in forming layers on the second source metal layer ML2.

The channel pattern AP is disposed on the gate insulating layer 120 in a region in which the control electrode GE is formed. The channel pattern AP is disposed in the separate region between the input electrode SE and the output electrode DE to partially make contact with each of the input electrode SE and the output electrode DE. An end portion of the input electrode SE facing the output electrode DE overlaps with a first end portion of the channel pattern AP and directly makes contact with the channel pattern AP. In addition, an end portion is of the output electrode DE facing the input electrode SE overlaps with a second end portion of the channel pattern AP opposing the first end portion and directly makes contact with the channel pattern AP.

The channel pattern AP includes an oxide semiconductor layer 130 and a first insulating layer 140 formed on the oxide semiconductor layer 130. The oxide semiconductor 130 of the channel pattern AP directly makes contact with each of the input electrode SE and the output electrode DE. For example, a lower surface of the oxide semiconductor 130 directly makes contact with an upper surface of each of the input electrode SE and the output electrode DE.

The oxide semiconductor layer 130 may include a single oxide compound such as gallium oxide, indium oxide, tin oxide and zinc oxide, etc., or a multiple oxide compound such as gallium indium zinc oxide ($Ga_2O_3$—$In_2O_3$—$ZnO$, GIZO), indium gallium tin oxide ($In_2O_3$—$Ga_2O_3$—$SnO$), indium zinc oxide ($In_2O_3$—$Zn_2O_3$), zinc aluminum oxide ($Zn_2O_3$—$Al_2O_3$), etc. The first insulating layer 140 may include silicon oxide ($SiO_2$), silicon nitride ($SiN_x$), etc.

In the channel pattern AP, a side surface of the oxide semiconductor layer 130 may be substantially coincided with a side surface of the first insulating layer 140. For example, in the channel pattern AP toward a separate portion HP, the side surface of the oxide semiconductor layer 130 may be substantially coincided with the side surface of the first insulating layer 140. The side surfaces of the oxide semiconductor layer 130 and the first insulating layer 140 may be defined as etched surfaces etched using a single etch stopping layer.

The insulating layer IP is spaced apart from the channel pattern AP and surrounds the channel pattern AP. In an embodiment, the insulating pattern IP includes a hole formed in a region corresponding to the channel pattern AP, and the channel pattern AP is spaced apart from is the insulating pattern IP in the hole. A region between the insulating pattern IP and the channel pattern AP may be defined as the "separate portion" HP. The insulating pattern IP is entirely formed on the base substrate 110 except for a region in which the channel pattern AP is formed and a region corresponding to the separate portion HP. The insulating pattern IP may insulate the source pattern and the pixel electrode PE from each other. In addition, the insulating pattern IP may protect the gate pattern and the source pattern which are formed under the insulating pattern IP.

The insulating pattern IP includes substantially the same layers as the oxide semiconductor layer 130 and the first insulating layer 140 of the channel pattern AP. In the insulating pattern IP, a side surface of the oxide semiconductor layer 130 may be substantially coincided with a side surface of the first insulating layer 140. For example, in the insulating pattern IP toward the separate portion HP, the side surfaces of the oxide semiconductor layer 130 and the first insulating layer 140 may be etched surfaces using one etch stopping layer.

The insulating pattern IP includes the contact hole PCT, the gate hole CT1 and the data hole CT2. The contact hole PCT partially exposes the output electrode DE, and the gate hole CT1 partially exposes the gate pad electrode GPE with the hole of the gate insulating layer 120. The data hole CT2 partially exposes the data pad electrode DPE.

The pixel electrode PE is formed on the insulating pattern IP and directly contacts the output electrode DE through the contact hole PCT. A portion of the pixel electrode PE directly contacts the output electrode DE, and a portion of the pixel electrode PE directly makes contact with the upper surface of the first insulating layer 140 of the insulating pattern IP. The pixel electrode PE may be formed from transparent and conductive material. For example, the pixel electrode PE may includes indium tin oxide (ITO) or indium zinc oxide (IZO).

The gate contact electrode GCE is formed on the insulating pattern IP corresponding to a region in which the gate pad electrode GPE is formed. The gate contact electrode GCE directly contacts the gate pad electrode GPE through the gate hole CT1. The data contact electrode DCE is formed on the insulating pattern IP corresponding to a region in which the data pad electrode DPE is formed. The data contact electrode DCE directly contacts the data pad electrode DPE through the data hole CT2. The gate contact electrode GCE and the data contact electrode DCE may be formed from substantially the same layer as the pixel electrode PE.

Figure 3A:
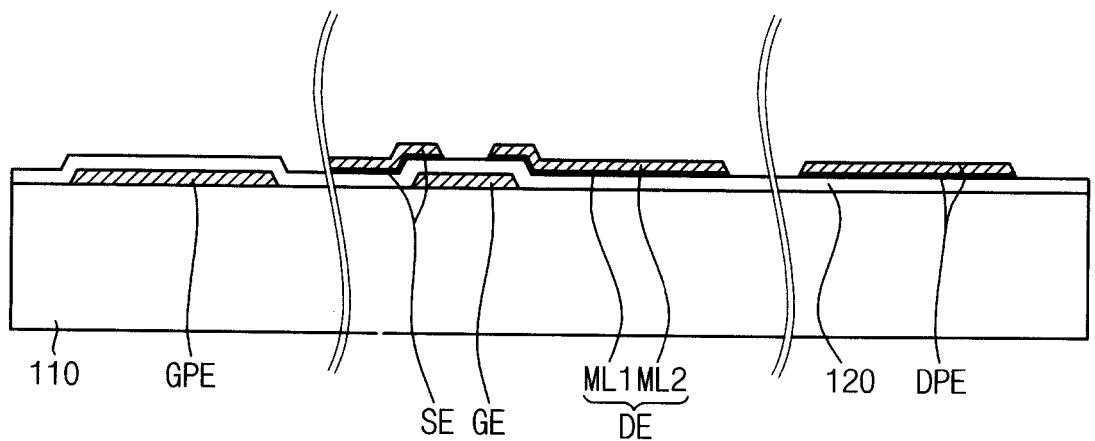
FIG. 3A, FIG. 3B and FIG. 3C are cross-sectional views illustrating a method of manufacturing the display substrate in FIG. 2.
Figure 3B:
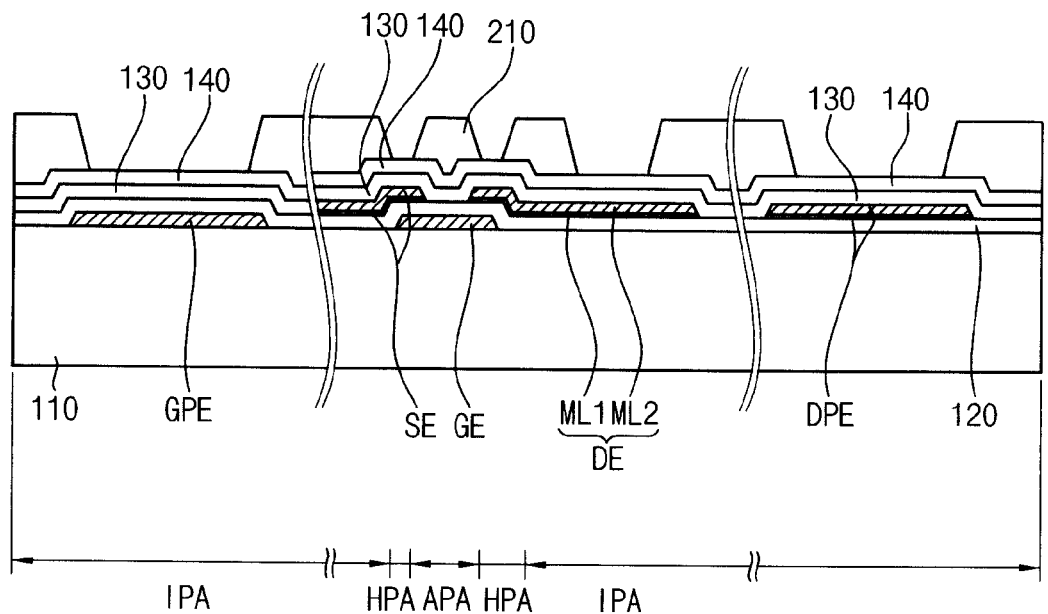
Figure 3C:
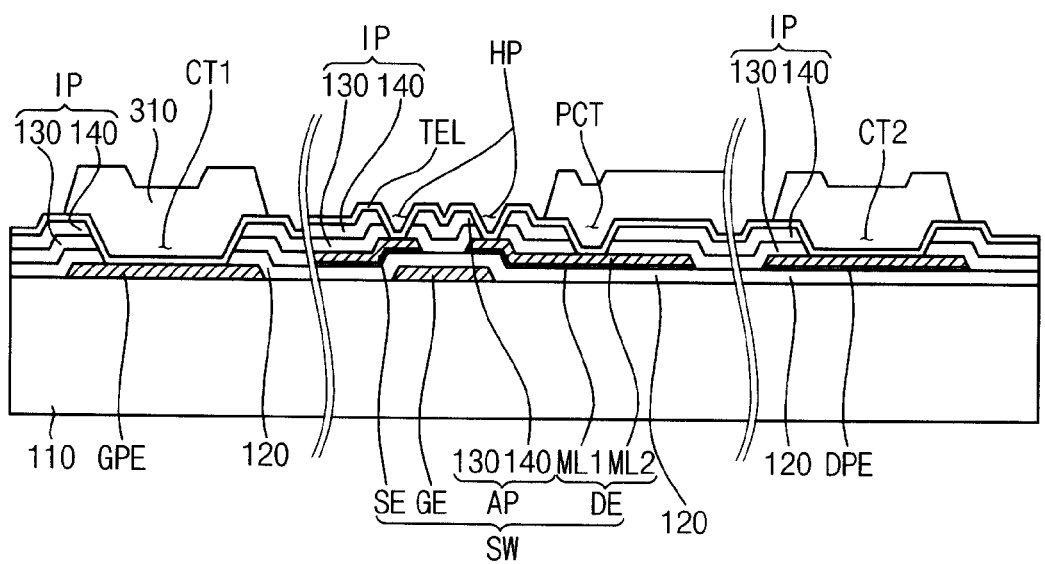

FIG. 3A, FIG. 3B and FIG. 3C are cross-sectional views illustrating a method of manufacturing the display substrate in FIG. 2.

Referring to FIG. 3A, the gate pattern including the control electrode GE and the gate pad electrode GPE, the gate insulating layer 120, and the source pattern including the input electrode SE, the output electrode DE and the data pad electrode DPE are sequentially formed on the base substrate 110.

For example, the gate pattern may be formed by patterning a gate metal layer formed on the base substrate 110 via a photolithography process. In the photolithography process, an etch stopping layer, for example, a photoresist pattern, is formed on the gate metal layer using a first mask (not shown), and the gate metal layer is patterned using the etch stopping layer. The gate metal layer covered by the etch stopping layer remains on the base substrate 110 to form the gate pattern, and the gate metal layer exposed by the etch stopping layer is removed.

The gate insulating layer 120 is formed on the base substrate 110 on which the gate pattern is formed. The gate insulating layer 120 is entirely formed on the base substrate 110.

The first source metal layer ML1 and the second source metal layer ML2 are sequentially formed on the base substrate 110 on which the gate insulating layer 120 is formed. The first source metal layer ML1 may include titanium and the second source metal layer ML2 may include copper. An etch stopping layer is formed on the second source metal layer ML2 using a second mask (not shown). The first and second source metal layers ML1 and ML2 are patterned using the etch stopping layer. The first and second source metal layers ML1 and ML2 are wet-etched using a single etchant to form the source pattern. The single etchant may be applied at one time to etch the first and second source metal layers ML1 and ML2. Although the first and second source metal layers ML1 and ML2 are wet-etched using the single etchant, the gate pattern is formed under the source pattern and the channel pattern AP is formed after forming the source pattern, so that the oxide semiconductor layer 130 may be prevented from being damaged by the single etchant preceding formation of the oxide semiconductor layer 130.

Referring to FIG. 3B, the oxide semiconductor layer 130 and the first insulating layer 140 are sequentially formed on the base substrate 110 on which the source pattern is formed. A photoresist pattern 210 is formed on the first insulating layer 140 using a third mask (not shown).

The oxide semiconductor layer 130 directly contacts each of the input electrode SE, the output electrode DE and the data pad electrode DPE. In addition, the oxide semiconductor layer 130 makes contact with the gate insulating layer 120 in a region in which the gate pad electrode GPE is formed. The oxide semiconductor layer 130 may be entirely formed on the base substrate 110 on which the source pattern is formed. The first insulating layer 140 is formed on the oxide semiconductor layer 130. The first insulating layer 140 may be entirely formed on the base substrate 110 on which the oxide semiconductor layer 130 is formed.

The photoresist pattern 210 is formed on the first insulating layer 140. The photoresist pattern 210 covers the first insulating layer 140 in a first region APA in which the channel pattern AP in FIG. 1 is formed and a second region IPA in which the insulating pattern IP is formed. The photoresist pattern 210 exposes the first insulating layer 140 in a third region HPA corresponding to the separate portion HP between the first and second regions APA and IPA. In the second region IPA, the first insulating layer 140 in regions corresponding to the contact hole PCT, the gate hole CT1 and the data hole CT2 is exposed through the photoresist pattern 210.

The first insulating layer 140 and the oxide semiconductor layer 130 are patterned using the photoresist pattern 210 as an etch stopping layer. The gate insulating layer 120 in regions in which the gate pad electrode GPE is formed is also patterned in patterning the first insulating layer 140 and the oxide semiconductor layer 130.

Referring to FIG. 3C, the first insulating layer 140 and the oxide semiconductor layer 130 are patterned to form the channel pattern AP and the insulating pattern IP. The channel pattern AP and the insulating pattern IP are spaced apart from each other by removing the first insulating layer 140 and the oxide semiconductor layer 130 in the third region HPA. The channel pattern AP and the insulating pattern IP are spaced apart from each other so that the channel pattern AP may function as a channel of the switching element SW between the input electrode SE and the output electrode DE, and the insulating pattern IP may protect patterns formed under the insulating pattern IP.

The insulating pattern IP includes the contact hole PCT, the gate hole CT1 and the data hole CT2. The oxide semiconductor layer 130 and the first insulating layer 140 on the output electrode DE are removed to form the contact hole PCT, and the oxide semiconductor is layer 130 and the first insulating layer 140 on the data pad electrode DPE are removed to form the data hole CT2. The gate insulating layer 120, the oxide semiconductor layer 130 and the first insulating layer 140 on the gate pad electrode GPE are removed to form the gate hole CT1 including the hole of the gate insulating layer 120.

A transparent electrode layer TEL is formed on the base substrate 110 on which the channel pattern AP and the insulating pattern IP are formed. The transparent electrode layer TEL is entirely formed on the base substrate 110. The transparent electrode layer TEL directly contacts the first insulating layer 140 of each of the channel pattern AP and the insulating pattern IP.

A photoresist pattern 310 is formed using a fourth mask (not shown) on the transparent electrode layer TEL. The transparent electrode layer TEL is patterned using the photoresist pattern 310 as an etch stopping layer. Thus, the pixel electrode PE, the gate contact electrode GCE and the data contact electrode DCE are formed on the insulating pattern IP.

Therefore, the display substrate 102 in FIGS. 1 and 2 is manufactured.

According to the present exemplary embodiment, the oxide semiconductor layer 130 and the first insulating layer 140 are patterned using one mask to decrease the number of masks used for manufacturing the display substrate 102. Therefore, the manufacturing cost of the masks may be decreased, and a process of patterning the oxide semiconductor layer 130 and the first insulating layer 140 may be simplified to improve productivity of the display substrate 102.

In addition, the channel pattern AP and the insulating pattern IP are formed after forming the source pattern including the input electrode SE and the output electrode DE so that the oxide semiconductor layer 130 of the channel pattern AP may be prevented from being is damaged by forming the source pattern in advance. Therefore, reliability of the switching element SW including the channel pattern AP may be improved and reliability of manufacturing the display substrate 102 may be improved.

Figure 4:
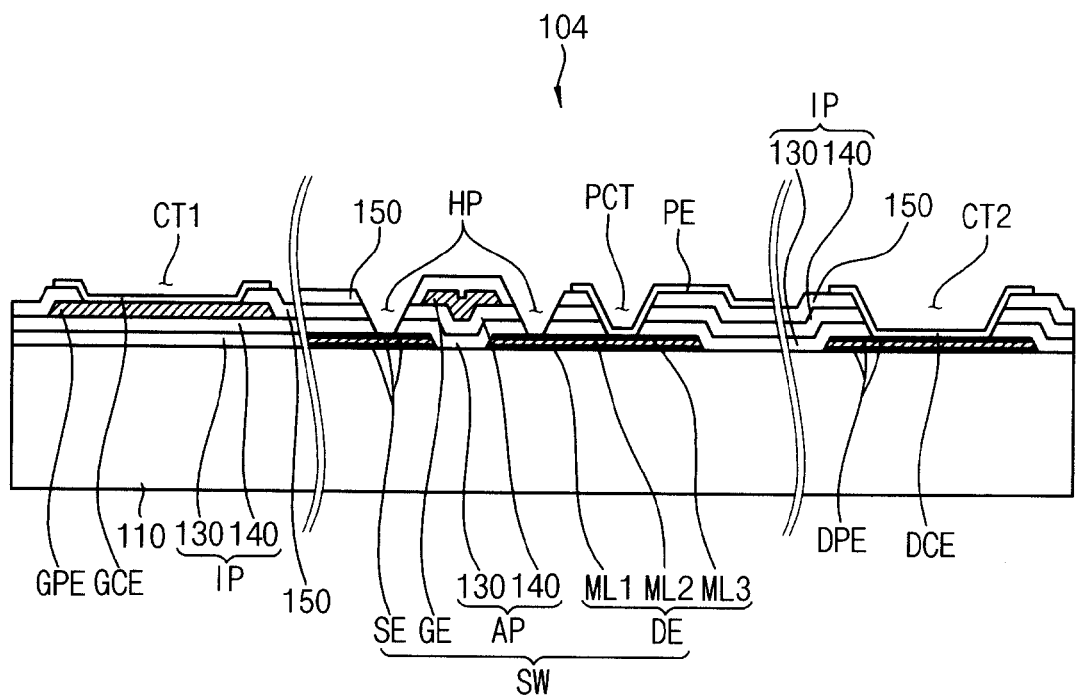
FIG. 4 is a cross-sectional view illustrating a display substrate according to another exemplary embodiment of the present invention.

FIG. 4 is a cross-sectional view illustrating a display substrate according to another exemplary embodiment of the present invention.

A plan view of a display substrate 104 in FIG. 4 is substantially the same as the plan view of the display substrate 102 in FIG. 1. Thus, the plan view of the display substrate 104 in FIG. 4 will refer to FIG. 1, and any repetitive descriptions concerning a plan structure of the display substrate 104 will be omitted.

Referring to FIG. 4 with FIG. 1, the display substrate 104 includes a source pattern, a channel pattern AP including an oxide semiconductor layer 130 and a first insulating layer 140, an insulating pattern IP, a gate pattern, a second insulating layer 150, a pixel electrode PE, a gate contact electrode GCE and a data contact electrode DCE.

The source pattern includes a data line DL, an input electrode SE connected to the data line DL, an output electrode DE spaced apart from the input electrode SE, and a data pad electrode DPE connected to an end portion of the data line DL. A lower surface of the source pattern directly contacts a surface of a base substrate 110. When the source pattern includes a first source metal layer ML1, a second metal layer ML2 and a third metal layer ML3, a lower surface of the first source metal layer ML1 directly contacts the surface of the base substrate 110. The first source metal layer ML1 may include titanium, the second source metal layer ML2 may include copper, and the third source metal layer ML3 may include titanium. Alternatively, the source pattern may include the first and second source metal layers ML1 and ML2 without including the third source metal layer ML3.

The channel pattern AP is formed in a separate region between the input electrode SE and the output electrode DE. The channel pattern AP includes the oxide semiconductor layer 130 and the first insulating layer 140 formed on the oxide semiconductor layer 130. In the channel pattern AP, a side surface of the oxide semiconductor layer 130 may be substantially coincided with a side surface of the first insulating layer 140.

Portions of the channel pattern AP contact portions of each of the input electrode SE and the output electrode DE. Thus, the oxide semiconductor layer 130 of the channel pattern AP directly contacts each of the input electrode SE and the output electrode DE. A lower surface of the oxide semiconductor layer 130 directly contacts an upper surface of each of the input electrode SE and the output electrode DE. An end portion of the input electrode SE facing the output electrode DE overlaps with a first end portion of the channel pattern AP and directly contacts the first end portion. In addition, an end portion of the output electrode DE facing the input electrode SE overlaps with and directly contacts a second end portion of the channel pattern AP opposing the first end portion.

The insulating pattern IP is spaced apart from the channel pattern AP and surrounds the channel pattern AP in a separate portion HP. The insulating pattern IP is entirely formed on the base substrate 110 except for a region in which the channel pattern AP is formed and a region corresponding to the separate portion HP. The insulating pattern IP includes a contact hole PCT partially exposing the output electrode DE and a data hole CT2 partially exposing the data pad electrode DPE. The insulating pattern IP is physically and electrically separated from the channel pattern IP by the separate portion HP. The insulating pattern IP may protect the source pattern.

The gate pattern includes a gate line GL crossing the data line DL, a control is electrode GE connected to the gate line GL and a gate pad electrode GPE formed at an end portion of the gate line GL. The gate line GL is formed on the insulating pattern IP to be insulated from the data line DL. The control electrode GE is formed on the channel pattern AP. The control electrode GE is disposed in a separate region between the input electrode SE and the output electrode DE, to overlap with an end portion of each of the input electrode SE and the output electrode DE. The control electrode GE directly contacts the first insulating layer 140 of the channel pattern AP. The gate pad electrode GPE is formed on the insulating pattern IP to directly contact the first insulating layer 140 of the insulating pattern IP.

The second insulating layer 150 is formed on the gate pattern, the channel pattern AP and the insulating pattern IP. Each of side surfaces of the second insulating layer 150 formed on the channel pattern AP and the insulating pattern IP may be coincided with side surfaces of the channel pattern AP and side surfaces of the insulating pattern IP. Thus, the second insulating layer 150 includes holes formed in regions corresponding to the separate portion HP, the contact hole PCT and the data hole CT2. In addition, the second insulating layer 150 further includes a gate hole CT1 partially exposing the gate pad electrode GPE.

The pixel electrode PE, the gate contact electrode GCE and the data contact electrode DCE are formed on the second insulating layer 150. The pixel electrode PE directly contacts the output electrode DE through the contact hole PCT and a first hole of the second insulating layer 150 corresponding to the contact hole PCT. The gate contact electrode GCE directly contacts the gate pad electrode GPE through the gate hole CT1 of the second insulating layer 150. In addition, the data contact electrode DCE directly contacts the data pad electrode DPE through the data hole CT2 and a second hole of the second insulating layer 150 corresponding to the data hole CT2.

Figure 5A:
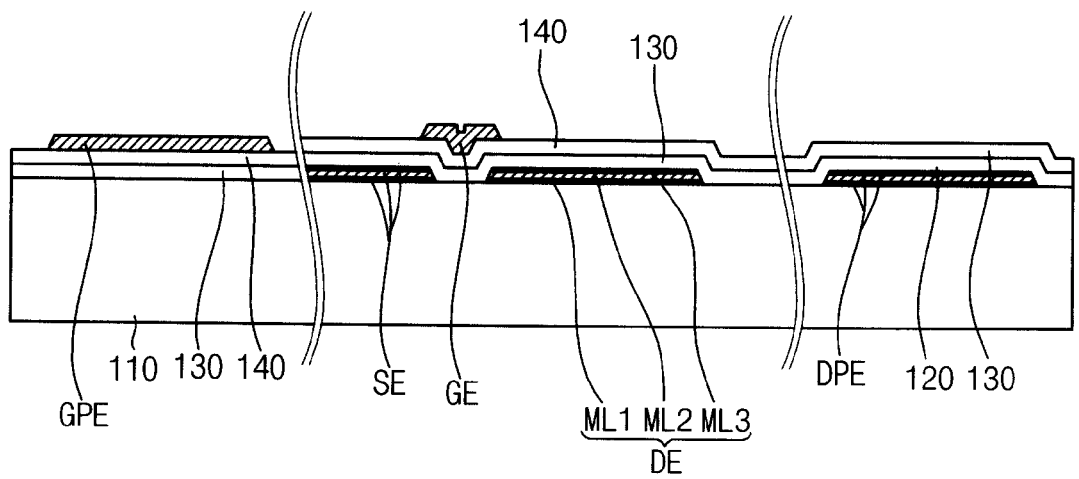
FIG. 5A, FIG. 5B and FIG. 5C are cross-sectional views illustrating a method of manufacturing the display substrate in FIG. 4.
Figure 5B:
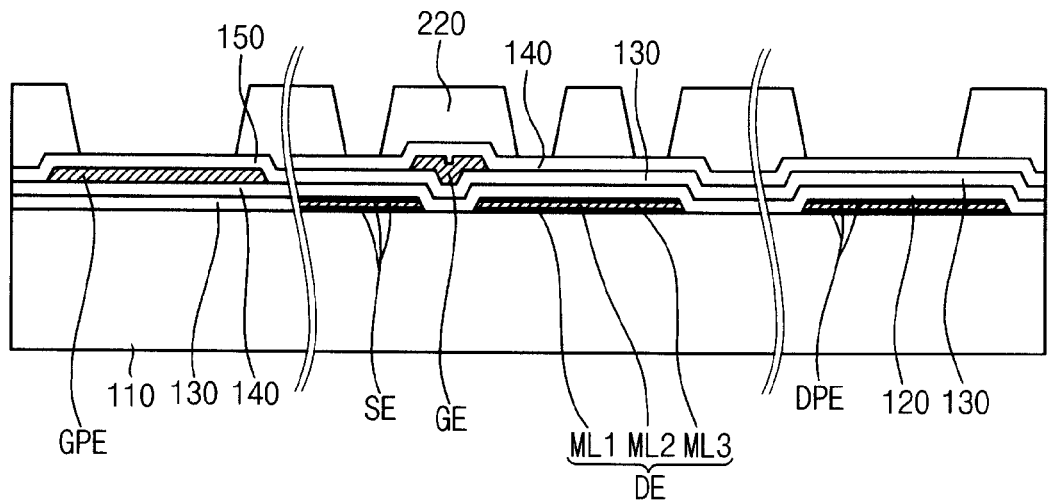
Figure 5C:
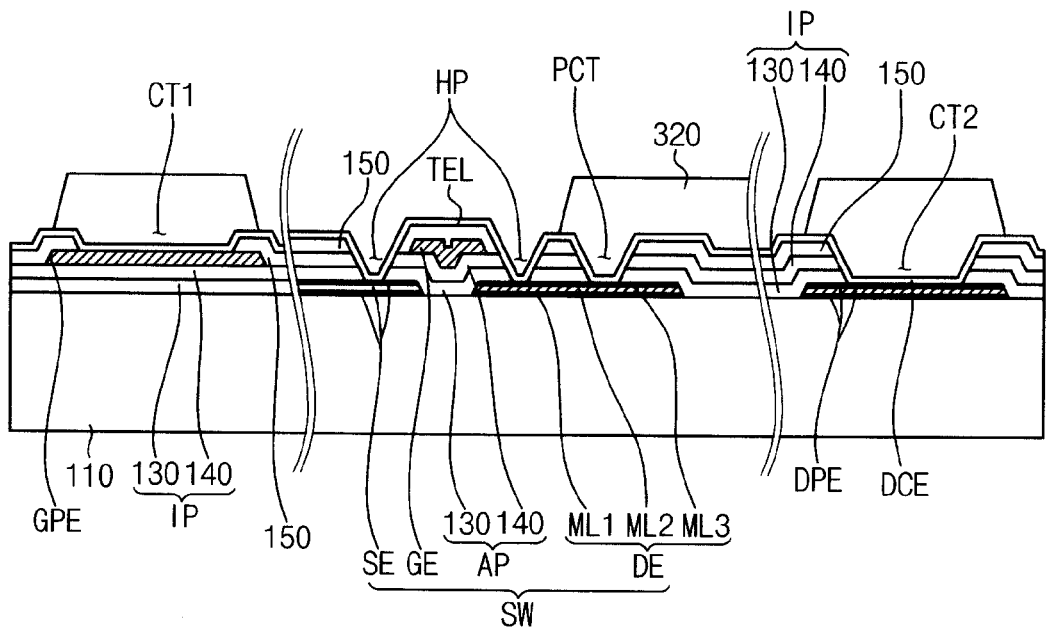

FIG. 5A, FIG. 5B and FIG. 5C are cross-sectional views illustrating a method of manufacturing the display substrate in FIG. 4.

Referring to FIG. 5A, the source pattern is formed on the base substrate 110 using a first mask, and the oxide semiconductor layer 130 and the first insulating layer 140 are sequentially formed on the base substrate 110 on which the source pattern is formed. The gate pattern is formed on the first insulating layer 140.

For example, the first, second and third metal layers ML1, ML2 and ML3 are sequentially formed on the base substrate 110, and an etch stopping layer is formed on the third metal layer ML3 using a first mask (not shown). Then, the first, second and third metal layers ML1, ML2 and ML3 are patterned using the etch stopping layer to form the source pattern. The first, second and third metal layers ML1, ML2 and ML3 may be wet-etched using a single etchant. The single etchant may be applied at one time to etch the first, second and third metal layers ML1, ML2 and ML3.

The oxide semiconductor layer 130 and the first insulating layer 140 are formed on the base substrate 110 on which the source pattern is formed. The oxide semiconductor layer 130 and the first insulating layer 140 are formed on the entire base substrate 110. The gate pattern is formed on the base substrate 110 on which the first insulating layer 140 is formed. A gate metal layer is formed on the entire base substrate 110 on which the first insulating layer 140 is formed, and the gate metal layer is patterned using a second mask (not shown) to form the gate pattern. The control electrode GE is formed in the separate region between the input electrode SE and the output electrode DE.

Referring to FIG. 5B, the second insulating layer 150 is formed on the base substrate 110 on which the gate pattern is formed. A photoresist pattern 220 is formed using a is third mask (not shown) on the second insulating layer 150.

The second insulating layer 150 is formed on the entire base substrate 110 to cover the entire gate pattern. The second insulating layer 150 directly contacts the gate pattern and the first insulating layer 140.

The photoresist pattern 220 exposes the second insulating layer 150 in a region corresponding to the separate portion HP. In addition, the photoresist pattern 220 exposes the second insulating layer 150 in regions in which the output electrode DE, the gate pad electrode GPE and the data pad electrode DPE are formed.

The second insulating layer 150, the first insulating layer 140 and the oxide semiconductor layer 130 are patterned using the photoresist pattern 220 as an etch stopping layer. Thus, a portion of the second insulating layer 150 on the gate pad electrode GPE is removed. Further, a portion of the second insulating layer 150, the first insulating layer 140 and the oxide semiconductor layer 130, which are formed on the output electrode DE, are removed. Furthermore, a portion of the first and second insulating layers 140 and 150 and the oxide semiconductor layer 130, which are formed on the data pad electrode DPE, are removed.

Referring to FIG. 5C, the first and second insulating layers 140 and 150 and the oxide semiconductor layer 130 are patterned to form the channel pattern AP and the insulating pattern IP including the contact hole PCT and the data hole CT2. In addition, the gate hole CT1 exposing the data pad electrode GPE and the hole corresponding to the separate portion HP and the hole corresponding to the data hole CT2 are formed through the second insulating layer 150.

A transparent electrode layer TEL is formed on the base substrate 110 on which the channel pattern AP, the insulating pattern IP and the patterned second insulating layer 150 are formed. A photoresist pattern 320 is formed on the transparent electrode layer TEL using a is fourth mask (not shown).

The transparent electrode layer TEL is formed on the entire base substrate 110. The transparent electrode layer TEL is patterned using the photoresist pattern 320 to form the gate contact electrode GCE, the pixel electrode PE and the data contact electrode DCE.

Thus, the display substrate 104 in FIG. 4 is manufactured.

According to the present exemplary embodiment, although the second insulating layer 150 capable of protecting the gate pattern is additionally formed, the second insulating layer 150 is patterned with the first insulating layer 140 and the oxide semiconductor layer 130 so that the display substrate 104 may be manufactured using the minimum number of masks without using an additional mask. Therefore, the manufacturing cost and the number of the manufacturing processes may be decreased to improve productivity of the display substrate 104. In addition, the channel pattern AP and the insulating pattern IP are formed after forming the source pattern so that the oxide semiconductor layer 130 may be fundamentally prevented from being damaged by an etchant or an etching gas used for forming the source pattern.

Figure 6:
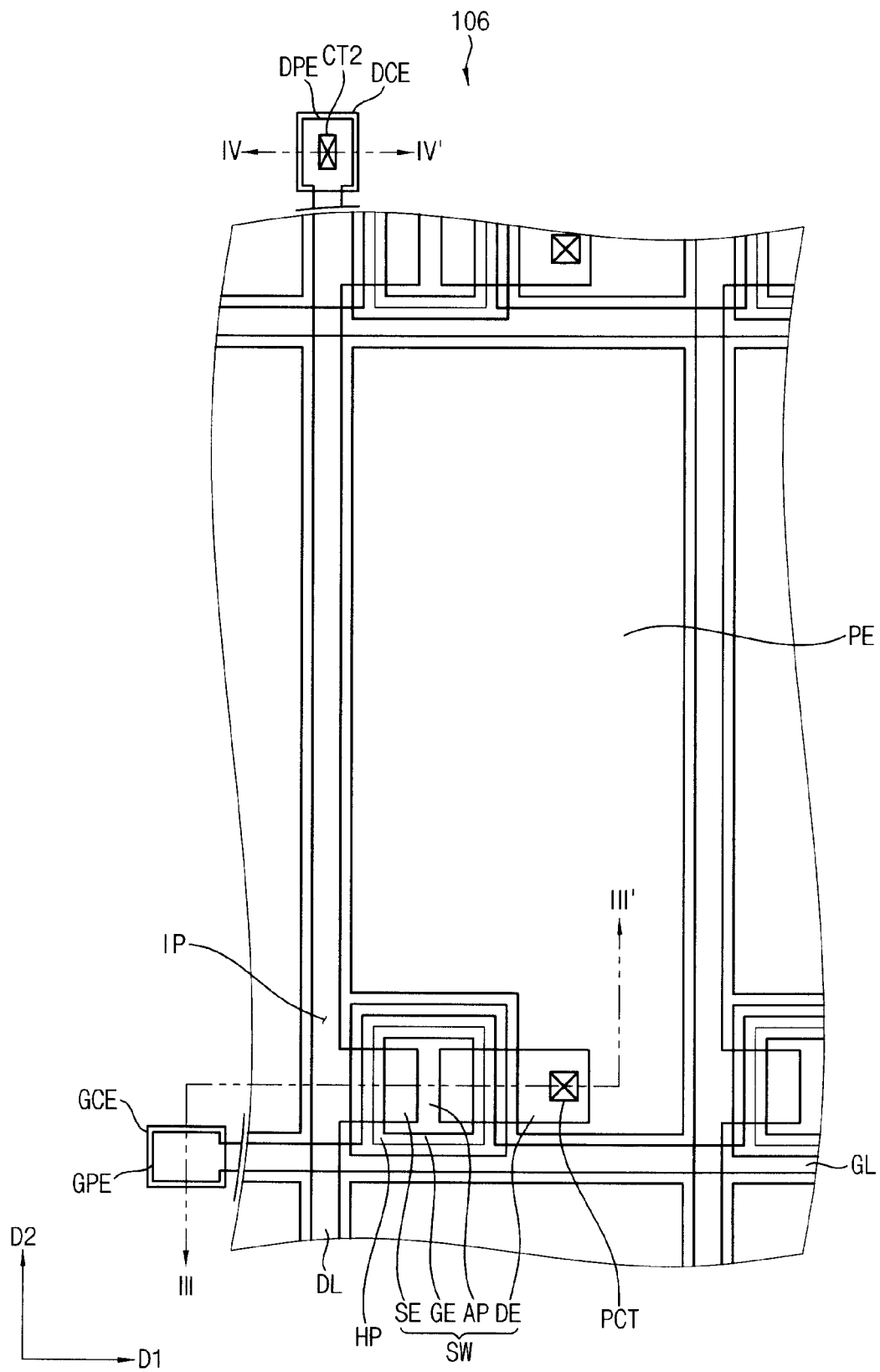
FIG. 6 is a plan view illustrating a display substrate according to still another exemplary embodiment of the present invention.

FIG. 6 is a plan view illustrating a display substrate according to still another exemplary embodiment of the present invention.

Figure 7:
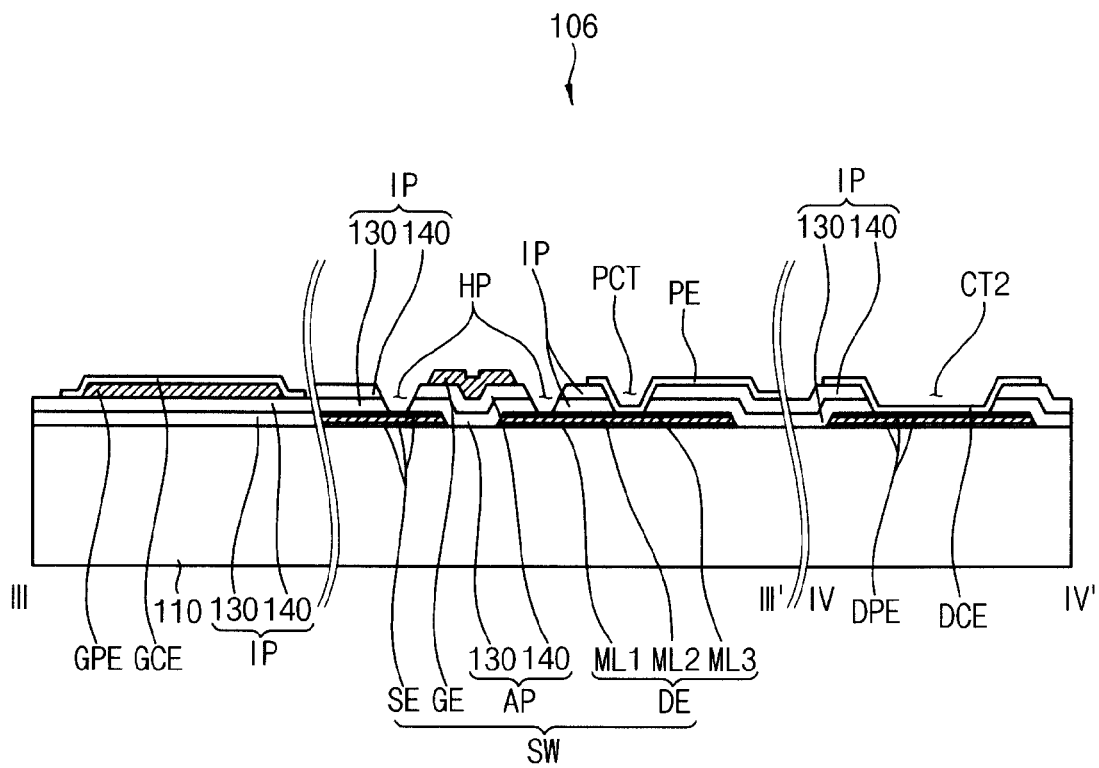
FIG. 7 is a cross-sectional view taken along line III-III' and line IV-IV' in FIG. 6.

FIG. 7 is a cross-sectional view taken along line III-III' and line IV-IV' in FIG. 6.

A plan structure of a display substrate 106 in FIG. 6 is substantially the same as that of the display substrate 102 in FIG. 1 except that a gate pad electrode GPE directly makes contact with a gate contact electrode GCE without the gate hole CT1 in FIGS. 1 and 2. In addition, a cross-sectional structure of the display substrate 106 is substantially the same as that of the display substrate 104 in FIG. 4 except for not including the second insulating layer 150. Thus, any repetitive descriptions with the plan structure illustrated referring to FIG. 1 and the is cross-sectional structure illustrated referring to FIG. 4 will be omitted.

Referring to FIGS. 6 and 7, the display substrate 106 includes a source pattern, a channel pattern AP, an insulating pattern IP, a gate pattern and a pixel electrode PE which are formed on a base substrate 110. The display substrate 106 further includes a gate contact electrode GCE and a data contact electrode DCE.

The source pattern includes a data line DL, an input electrode SE, an output electrode DE and a data pad electrode DPE. The source pattern is formed on the base substrate 110.

The channel pattern AP is formed in a separate region between an input electrode SE and an output electrode DE of the source pattern. Two opposite end portions of the channel pattern AP directly contact the input and output electrodes SE and DE, respectively. The channel pattern AP includes an oxide semiconductor layer 130 and a first insulating layer 140 formed on the oxide semiconductor layer 130.

The insulating pattern IP is spaced apart from the channel pattern AP and surrounds the channel pattern AP. The data line DL and a gate line GL of the gate pattern are insulated from each other by the insulating pattern IP. The insulating pattern IP includes a contact hole PCT exposing a portion of the output electrode DE and a data hole CT2 exposing a portion of the data pad electrode DPE. The insulating pattern IP has substantially the same layered structure as the channel pattern AP.

The gate pattern includes the gate line GL, a control electrode GE and a gate pad electrode GPE. The control electrode GE is formed on the first insulating layer 140 of the channel pattern AP. The gate pad electrode GPE is formed on the first insulating layer 140 of the insulating pattern IP.

The pixel electrode PE is formed on the insulating pattern IP and makes direct contact with the output electrode DE through the contact hole PCT. The gate contact electrode GCE is formed on the gate pad electrode GPE to entirely cover the gate pad electrode GPE. The gate pad electrode GPE is formed on the insulating pattern IP so that the gate contact electrode GCE entirely covers the gate pad electrode GPE. The data contact electrode DCE is formed on the insulating pattern IP to make direct contact with a portion of the data pad electrode DPE through the data hole CT2.

Figure 8A:
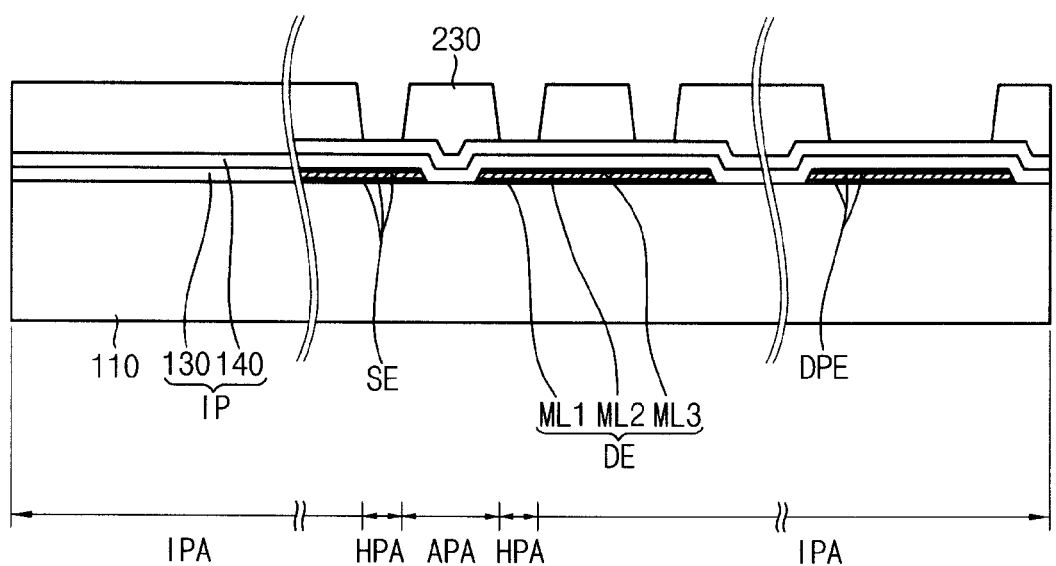
FIG. 8A and FIG. 8B are cross-sectional views illustrating a method of is manufacturing the display substrate in FIG. 7.
Figure 8B:
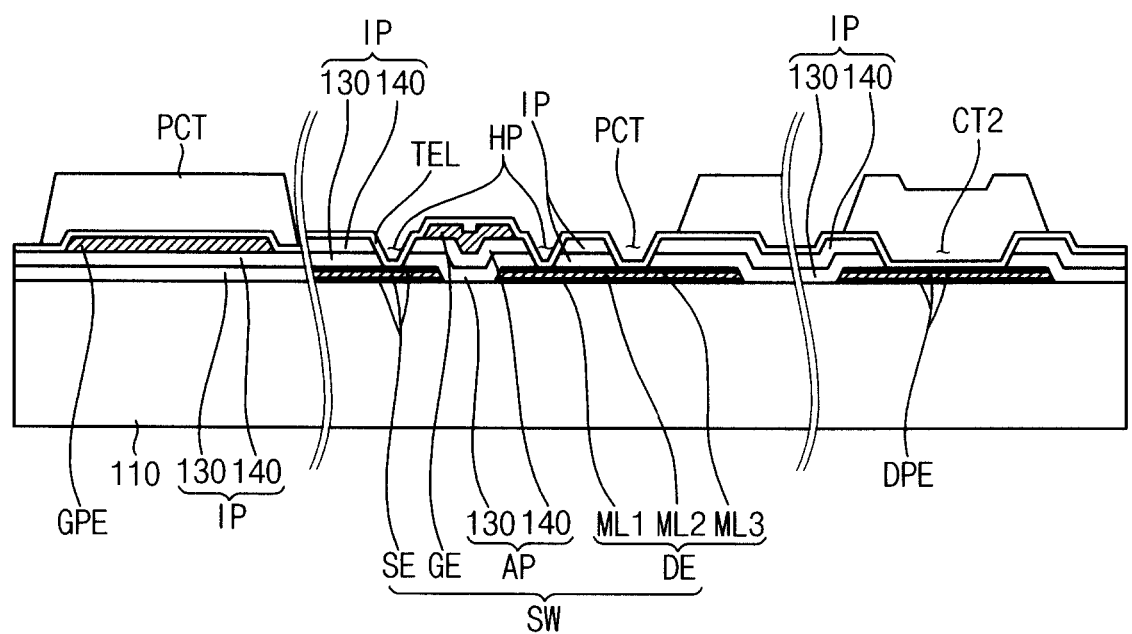

FIGS. 8A and 8B are cross-sectional views illustrating a method of manufacturing the display substrate 106 in FIG. 7.

Referring to FIG. 8A, the source pattern is formed on the base substrate 110 using a first mask (not shown), and then the oxide semiconductor layer 130 and the first insulating layer 140 are sequentially formed on the base substrate 110. The oxide semiconductor layer 130 and the first insulating layer 140 are formed on the entire base substrate 110. Then, a photoresist pattern 230 is formed on the first insulating layer 140 using a second mask (not shown).

The photoresist pattern 230 covers the first insulating layer 140 in a first region APA in which the channel pattern AP is formed and the first insulating layer 140 in a second region IPA in which the insulating pattern IP is formed, and exposes the first insulating layer 140 in a third region HPA corresponding a separate portion HP between the first and second regions APA and IPA. In the second region IPA, the first insulating layer 140 in regions corresponding to the contact hole PCT and the data hole CT2 of the insulating pattern IP is exposed by the photoresist pattern 230.

The first insulating layer 140 and the oxide semiconductor layer 130 are patterned using the photoresist pattern 230 as an etch stopping layer.

Referring to FIG. 8B, the first insulating layer 140 and the oxide semiconductor layer 130 are patterned to form the channel pattern AP and the insulating pattern IP. The channel pattern AP and the insulating pattern IP are spaced apart from each other by removing the first insulating layer 140 and the oxide semiconductor layer 130 in the third region HPA to form the separate portion HP.

The gate pattern is formed on the base substrate 110 on which the channel pattern AP and the insulating pattern IP are formed. The gate pattern is formed via patterning a gate metal layer using an etch stopping layer formed by a third mask (not shown). The control electrode GE is formed on the channel pattern AP, and the gate line GL and the gate pad electrode GPE are formed on the insulating pattern IP.

A transparent electrode layer TEL is formed on the base substrate 110 on which the gate pattern is formed. A photoresist pattern 330 is formed on the transparent electrode layer TEL using a fourth mask (not shown), and then the transparent electrode layer TEL is patterned using the photoresist pattern 330 as an etch stopping layer. Thus, the pixel electrode PE, the gate contact electrode GCE and the data contact electrode DCE are formed.

Therefore, the display substrate 106 in FIGS. 6 and 7 is manufactured.

According to the present exemplary embodiment, the oxide semiconductor layer 130 and the first insulating layer 140 are patterned using a single mask to decrease the number of masks used for manufacturing the display substrate 106. In addition, the channel pattern AP and the insulating pattern IP are formed after forming the source pattern so that the oxide semiconductor layer 130 may be fundamentally prevented from being damaged during forming of the source pattern.

Figure 9:
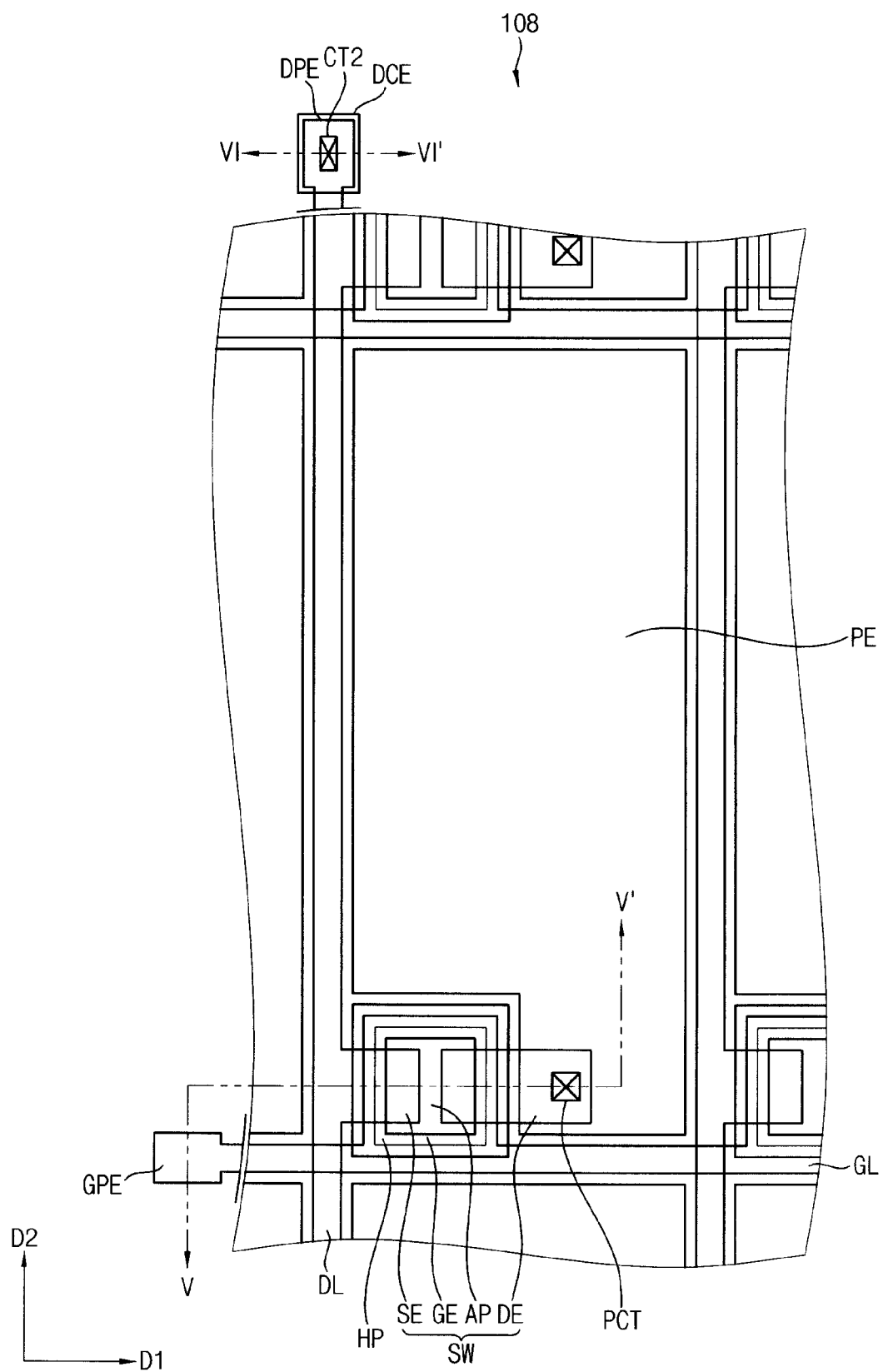
FIG. 9 is a plan view illustrating a display substrate according to still another exemplary embodiment of the present invention.

FIG. 9 is a plan view illustrating a display substrate according to still another is exemplary embodiment of the present invention.

Figure 10:
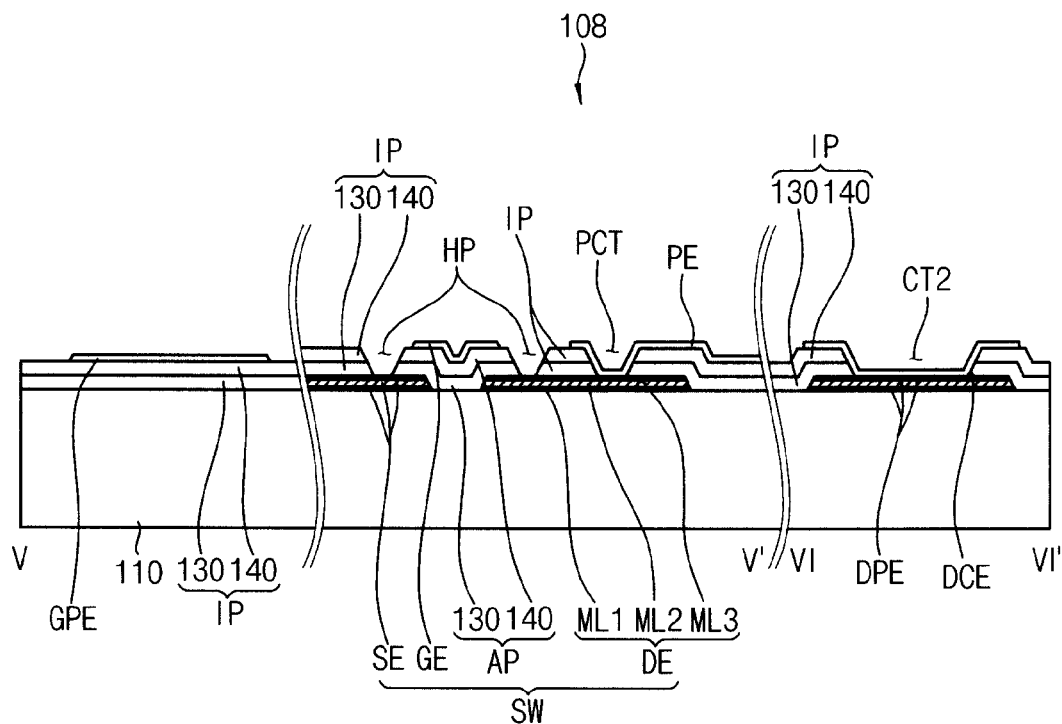
FIG. 10 is a cross-sectional view taken along line V-V' and line VI-VI' in FIG. 9.

FIG. 10 is a cross-sectional view taken along line V-V' and line VI-VI' in FIG. 9.

A display substrate 108 illustrated in FIGS. 9 and 10 is substantially the same as the display substrate 104 illustrated in FIGS. 6 and 7 except that a gate pattern including a control electrode GE includes the same layer as the pixel electrode PE and the gate contact electrode GCE in FIGS. 6 and 7, and the gate contact electrode GCE is not formed on a gate pad electrode GPE. Thus, any repetitive descriptions will be omitted.

Referring to FIGS. 9 and 10, the display substrate 108 includes a source pattern formed on a base substrate 110, a channel pattern AP, an insulating pattern IP, the gate pattern, the pixel electrode PE and a data contact electrode DCE.

The source pattern includes a data line DL, an input electrode SE, an output electrode DE and a data pad electrode DPE. The source pattern includes a first source metal layer ML1, a second source metal layer ML2 and a third source metal layer ML3. Alternatively, the source pattern may have a double layered structure including the first and second source metal layers ML1 and ML2 without the third source metal layer ML3. Here, the first source metal layer ML1 may include titanium and the second source metal layer ML2 may include copper.

The channel pattern AP is formed in a separate region between the input electrode SE and the output electrode DE. The insulating pattern IP includes a contact hole partially exposing the output electrode DE and a data hole CT2 partially exposing the data pad electrode DPE. Each of the insulating pattern IP and the channel pattern AP includes an oxide semiconductor layer 130 directly making contact with a surface of the source pattern and/or the base substrate 110, and a first insulating layer 140 formed on the oxide semiconductor layer 130.

The gate pattern includes a gate line GL, a control electrode GE and a gate pad electrode GPE. The gate pattern includes substantially the same layer as the pixel electrode PE. For example, the gate pattern may be formed in forming the pixel electrode PE. Alternatively, the pixel electrode PE may be formed in forming the gate pattern. The gate pattern may be formed from the same transparent and conductive material as the pixel electrode PE.

The pixel electrode PE makes contact with the output electrode DE through the contact hole PCT. A portion of the data pad electrode DPE makes contact with the data contact electrode DCE including substantially the same layer as the pixel electrode PE through the data hole CT2.

Figure 11:
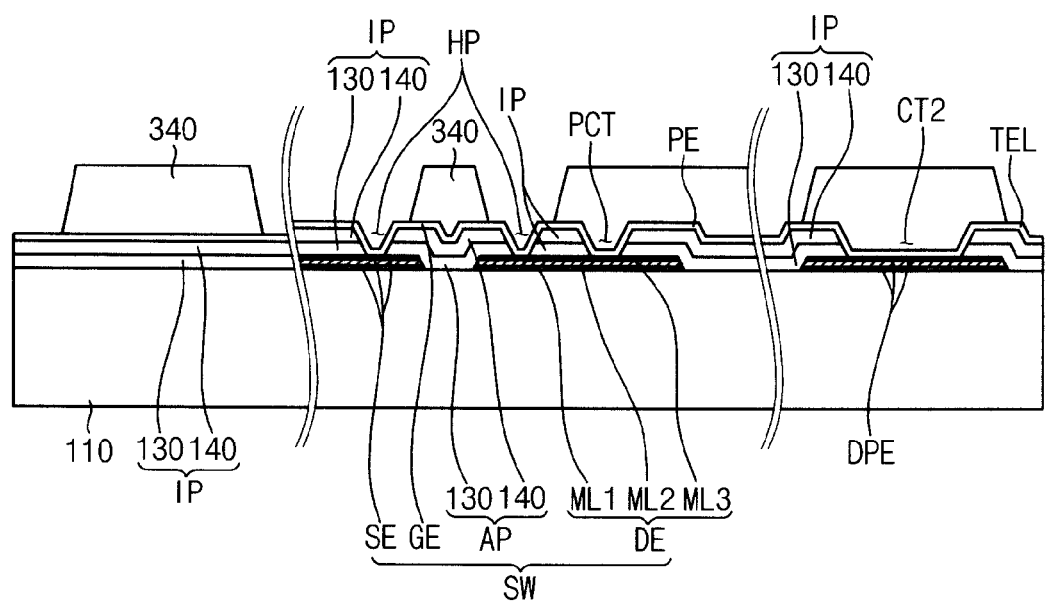
FIG. 11 is a cross-sectional view illustrating a method of manufacturing the display substrate in FIG. 10.

FIG. 11 is a cross-sectional view illustrating a method of manufacturing the display substrate in FIG. 10.

In a method of manufacturing the display substrate 108 in FIG. 10, processes before forming the gate pattern, the pixel electrode PE and the data contact electrode DCE are substantially the same as the processes explained referring to FIG. 8A. Thus, any repetitive descriptions will be omitted, and the processes for forming the gate pattern, the pixel electrode PE and the data contact electrode DCE on the base substrate 110 on which the channel pattern AP and the insulating pattern IP are formed will be explained referring to FIG. 11.

Referring to FIG. 11, a transparent electrode layer TEL is formed on the base substrate 110 on which the channel pattern AP and the insulating pattern IP are formed. The transparent electrode layer TEL entirely covers the base substrate 110 on which the channel pattern AP and the insulating pattern IP are formed.

A photoresist pattern 340 is formed on the transparent electrode layer TEL using a third mask (not shown). The third mask is different from the first mask forming the source is pattern and the second mask forming the channel pattern AP and the insulating pattern IP. The transparent electrode layer TEL is patterned using the photoresist pattern 340 as an etch stopping layer to form the gate pattern, the pixel electrode PE and the data pad electrode DPE. For example, the transparent electrode layer TEL is patterned to form the gate line GL, the control electrode GE, the gate pad electrode GPE, the pixel electrode PE and the data contact electrode DCE. The gate pattern in FIGS. 9 and 10 may be a transparent pattern such as the pixel electrode PE and the data contact electrode DCE.

Accordingly, the display substrate 108 in FIGS. 9 and 10 is manufactured.

According to the present exemplary embodiment, the gate pattern, the pixel electrode PE and the data contact electrode DCE are formed by patterning a single layer using the third mask to decrease the number of masks used for manufacturing the display substrate 108, compared to the number of the masks used for manufacturing the display substrate 106 in FIGS. 6 and 7. Thus, productivity of the display substrate 108 may be improved. In addition, in manufacturing the display substrate 108, the channel pattern AP and the insulating pattern IP are formed after forming the source pattern so that the oxide semiconductor layer 130 may be fundamentally prevented from being damaged by an etchant or an etching gas used for forming the source pattern.

According to the exemplary embodiments of the present invention, the display substrate may include a TFT having minimal fabrication damage of the oxide semiconductor layer. Thus, reliability of the display substrate including the TFT may be improved.

In addition, the oxide semiconductor layer is patterned with the first insulating layer using one mask to decrease the number of masks used for manufacturing the display substrate. Furthermore, the damage of the oxide semiconductor layer may be minimized in patterning the oxide semiconductor layer and the first insulating layer. Therefore, productivity of the display substrate and reliability in manufacturing the display substrate may be improved.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A display substrate, comprising:
a data line on a base substrate;
a channel pattern disposed in a region between an input electrode connected to the data line and an output electrode spaced apart from the input electrode, the channel pattern contacts the input electrode and the output electrode and being disposed on the input and output electrodes;

an insulating pattern spaced apart from the channel pattern, and comprising a contact hole exposing at least a portion of the output electrode; and a pixel electrode disposed on the insulating pattern, the pixel electrode connected to the output electrode through the contact hole.

2. The display substrate of claim 1, wherein each of the channel pattern and the insulating pattern comprises an oxide semiconductor layer and a first insulating layer formed on the oxide semiconductor layer.

3. The display substrate of claim 2, wherein an upper surface of each of the input electrode and the output electrode directly contacts lower surfaces of the oxide semiconductor layers of the channel pattern and the insulating pattern.

4. The display substrate of claim 2, wherein a side surface of the oxide semiconductor layer is substantially coincided with a side surface of the first insulating layer in each of the channel pattern and the insulating pattern.

5. The display substrate of claim 1, further comprising:
a gate line crossing the data line and disposed under the insulating pattern;
a control electrode connected to the gate line; and
a second insulating layer disposed on the control electrode, wherein the input electrode and the output electrode are disposed on the second insulating layer.

6. The display substrate of claim 1, further comprising:
a gate line crossing the data line and disposed on the insulating pattern; and
a control electrode connected to the gate line and disposed on the channel pattern.

7. The display substrate of claim 6, wherein each of the control electrode and the gate line comprises the same layer as the pixel electrode.

8. The display substrate of claim 6, further comprising:
a second insulating layer disposed on each of the control electrode and the insulating pattern,
wherein the pixel electrode is disposed on the second insulating layer.

9. The display substrate of claim 1, wherein each of the data line, the input electrode and the output electrode comprises a first titanium (Ti) layer and a copper (Cu) layer disposed on the first titanium layer.

10. The display substrate of claim 9, wherein each of the data line, the input electrode and the output electrode further comprises a second titanium layer disposed on the copper layer.

11. A thin film transistor (TFT), comprising:
an input electrode disposed on a substrate;
an output electrode spaced apart from the input electrode on the substrate; and
a channel pattern disposed in a region between the input electrode and the output electrode, the channel pattern contacting the input electrode and the output electrode and being disposed on the input and output electrodes, the channel pattern comprising an oxide semiconductor layer and a first insulating layer formed on the oxide semiconductor layer,
wherein a side surface of the oxide semiconductor layer is substantially coincided with a side surface of the first insulating layer in the channel pattern.

12. The TFT of claim 11, further comprising:
a control electrode disposed under the channel pattern; and
a second insulating layer disposed on the control electrode, wherein the input electrode and the output electrode are disposed on the second insulating layer.

13. The TFT of claim 11, further comprising:
a control electrode disposed on the channel pattern; and
a second insulating layer disposed on the control electrode.

14. The TFT of claim 11, wherein each of the input electrode and the output electrode comprises a first titanium (Ti) layer and a copper (Cu) layer disposed on the first titanium layer.

15. The TFT of claim 14, wherein each of the input electrode and the output electrode further comprises a second titanium layer disposed on the copper layer.

* * * * *